United States Patent
Hintersteiner et al.

(10) Patent No.: US 6,989,920 B2
(45) Date of Patent: Jan. 24, 2006

(54) SYSTEM AND METHOD FOR DOSE CONTROL IN A LITHOGRAPHIC SYSTEM

(75) Inventors: Jason D. Hintersteiner, Bethel, CT (US); Karel van der Mast, Helmond (NL); Arno Bleeker, Westerhoven (NL)

(73) Assignee: ASML Holding N.V., Veldhoven (NL)

( * ) Notice: Subject to any disclaimer, the term of this patent is extended or adjusted under 35 U.S.C. 154(b) by 174 days.

(21) Appl. No.: 10/447,214

(22) Filed: May 29, 2003

(65) Prior Publication Data

US 2004/0239907 A1 Dec. 2, 2004

(51) Int. Cl.
*G02B 26/00* (2006.01)
*G03B 27/72* (2006.01)
*G01J 3/30* (2006.01)
*G01N 21/86* (2006.01)
*G03C 5/00* (2006.01)

(52) U.S. Cl. ............... 359/237; 359/291; 359/224; 359/618; 359/619; 359/622; 359/627; 359/855; 355/53; 355/55; 355/67; 355/69; 356/317; 250/548; 250/492.1; 250/461.1; 385/140; 430/30

(58) Field of Classification Search .......... 359/237, 359/224, 290, 291, 298, 618, 619, 622, 627, 359/637, 855; 430/5, 22, 30; 355/53, 55, 355/67, 69, 71, 77; 250/548, 492.1, 492, 250/458.1, 461.1, 492.2; 356/317; 385/140
See application file for complete search history.

(56) References Cited

U.S. PATENT DOCUMENTS

| | | | | |
|---|---|---|---|---|
| 4,786,149 A | * | 11/1988 | Hoenig et al. | 359/290 |
| 5,229,872 A | | 7/1993 | Mumola | 349/2 |
| 5,296,891 A | | 3/1994 | Vogt et al. | 355/67 |
| 5,500,736 A | | 3/1996 | Koitabashi et al. | 356/620 |
| 5,523,193 A | | 6/1996 | Nelson | 430/311 |
| 5,530,482 A | | 6/1996 | Gove et al. | 348/441 |
| 5,579,147 A | | 11/1996 | Mori et al. | 359/204 |
| 5,661,712 A | * | 8/1997 | Chiba | 369/116 |
| 5,677,703 A | | 10/1997 | Bhuva et al. | 345/84 |
| 5,745,281 A | * | 4/1998 | Yi et al. | 359/290 |
| 5,808,797 A | | 9/1998 | Bloom et al. | 359/572 |
| 5,982,553 A | | 11/1999 | Bloom et al. | 359/627 |
| 5,995,688 A | * | 11/1999 | Aksyuk et al. | 385/14 |
| 6,133,986 A | | 10/2000 | Johnson | 355/67 |
| 6,163,643 A | * | 12/2000 | Bergmann et al. | 385/140 |
| 6,173,105 B1 | * | 1/2001 | Aksyuk et al. | 385/140 |
| 6,177,980 B1 | | 1/2001 | Johnson | 355/67 |
| 6,275,320 B1 | * | 8/2001 | Dhuler et al. | 359/237 |
| 6,312,134 B1 | * | 11/2001 | Jain et al. | 359/855 |
| 6,473,237 B2 | * | 10/2002 | Mei | 359/619 |
| 6,552,855 B1 | * | 4/2003 | Kowarz et al. | 359/627 |
| 6,567,163 B1 | * | 5/2003 | Sandstrom | 356/317 |
| 6,573,977 B1 | * | 6/2003 | Mori | 355/69 |
| 6,687,041 B1 | | 2/2004 | Sandstrom | 359/291 |
| 6,747,783 B1 | | 6/2004 | Sandstrom | 359/290 |
| 6,795,169 B2 | | 9/2004 | Tanaka et al. | 355/67 |
| 6,806,897 B2 | | 10/2004 | Kataoka et al. | 347/256 |
| 6,809,954 B1 | * | 10/2004 | Madan et al. | 365/145 |
| 6,811,953 B2 | | 11/2004 | Hatada et al. | 430/311 |
| 2004/0041104 A1 | | 3/2004 | Liebregts et al. | 250/492.22 |
| 2004/0130561 A1 | | 7/2004 | Jain | 345/694 |
| 2005/0007572 A1 | | 1/2005 | George et al. | 355/55 |

FOREIGN PATENT DOCUMENTS

| WO | WO 98/33096 | 7/1998 |
|---|---|---|
| WO | WO 98/38597 | 9/1998 |

* cited by examiner

*Primary Examiner*—Loha Ben
(74) *Attorney, Agent, or Firm*—Sterne, Kessler, Goldstein & Fox P.L.LC.

(57) ABSTRACT

A system and method are used for pulse to pulse dose control in an illumination system, used, for example, in a lithography or a maskless lithography machine. The system and method can be used to decrease effective laser pulse-to-pulse variability in lithographic lasers, allowing adequate dose control using a minimum number of pulses (e.g. as little as one pulse).

40 Claims, 9 Drawing Sheets

SYSTEM AND METHOD FOR DOSE CONTROL IN A LITHOGRAPHIC SYSTEM

BACKGROUND OF THE INVENTION

1. Field of the Invention

The present invention relates generally to lithography. More particularly, the present invention relates to dose control in lithography.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and/or grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles is required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a spatial light modulator (SLM) (e.g., a digital micromirror device (DMD), a liquid crystal display (LCD), or the like). The SLM includes an array of active areas (e.g., mirrors or transmissive areas) that are either ON or OFF to form a desired pattern. A predetermined and previously stored algorithm based on a desired exposure pattern is used to turn ON and OFF the active areas.

Conventional SLM-based writing systems (e.g., Micronic's Sigma 7000 series tools) use one SLM as the pattern generator. To achieve linewidth and line placement specifications, gray scaling is used. For analog SLMs, gray scaling is achieved by controlling mirror tilt angle (e.g., Micronic SLM) or polarization angle (e.g., LCD). For digital SLMs (e.g., TI DMD), gray scaling is achieved by numerous passes or pulses, where for each pass or pulse the pixel can be switched either ON or OFF depending on the level of gray desired. Because of the total area on the substrate to be printed, the spacing between active areas, the timing of light pulses, and the movement of the substrate, several passes of the substrate are required to expose all desired areas. This results in low throughput (number of pixels packed into an individual optical field/number of repeat passes required over the substrate) and increased time to fabricate devices. Furthermore, using only one SLM requires more pulses of light or more exposure time to increase gray scale. This can lead to unacceptably low levels of throughput.

Maskless lithography systems require utilizing a minimum number of pulses to achieve dose in order to meet reasonable throughputs. Hence, it is not possible to take advantage of 50 pulse averages as in conventional lithography systems to achieve acceptable laser pulse-to-pulse variations. Conventional lithography systems use 30–50 pulses to write each feature. Typically, in maskless lithography 2–4 pulses are used to write each feature for reasonable throughput. A need to use fewer pulses can be because the field of view of the projection optics in maskless lithography is about 0.5 mm×1 mm, which is relatively small compared to about 5 mm×26 mm in conventional lithography systems. Thus, a system has to deliver all the energy required to pattern the features on the wafer in two pulses because of the smaller area. There is a reduction in the ability to average pulses, which increases the effect of noise within each pulse. Typical lithography lasers can have pulse to pulse variation 9–10%, which can result in an unacceptable exposure energy variation on the substrate because of the lack of significant pulse averaging. Thus, dose amount (e.g., the energy delivered during each pulse) is very hard to control in maskless lithography when so few pulses are used.

Therefore, a system and method for dose control in maskless lithography is needed to stabilize pulse-to-pulse dose variation.

SUMMARY OF THE INVENTION

The present invention provides an illumination system including a light source and an adjusting system that adjusts light output from the light source to produce a desired light output signal.

The present invention also provides an illumination system including a light source and a non-linear optical attenuator that attenuates light from the light source.

The present invention further provides an illumination system including a first light source that produces a first light beam having a first energy value, a second light source that produces a second light beam having a second energy value, an adjusting system that adjusts the second light beam based on the first energy value, and a combining device that combines the adjusted second light beam and the first light beam.

The present invention further provides an illumination system including a light source that generates a light beam, a beam splitter that splits the light beam into first and second light beams, an adjustment system that adjusts the first light beam based on an energy value of the second light beam, and a combining device that combines the adjusted first light beam and the second light beam.

The present invention further provides a maskless lithography system having an illumination system, the illumination system including a light source and an adjusting system that adjusts light output from the light source to produce a desired light output signal.

Further embodiments, features, and advantages of the present inventions, as well as the structure and operation of the various embodiments of the present invention, are described in detail below with reference to the accompanying drawings.

BRIEF DESCRIPTION OF THE DRAWINGS/ FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
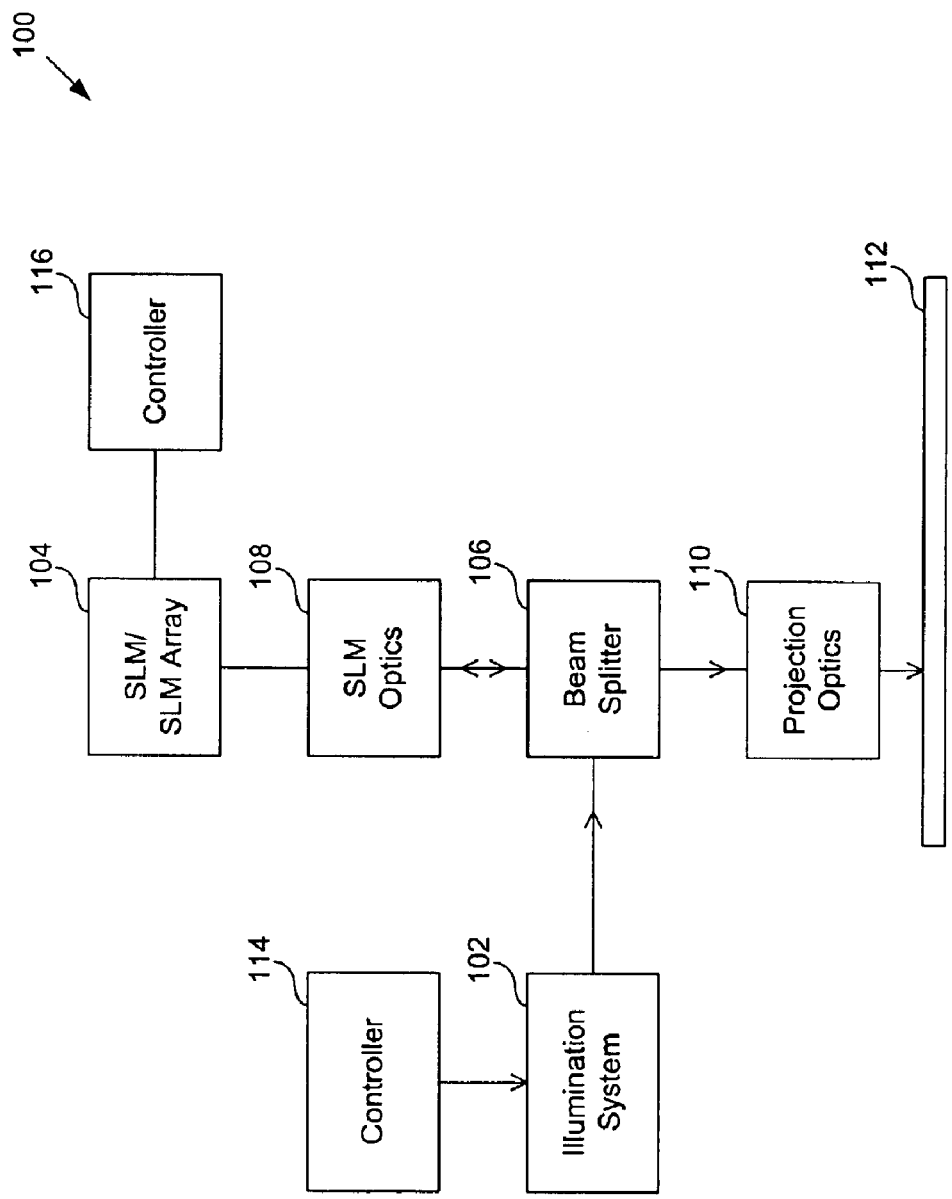
FIG. 1 shows a maskless lithography system having reflective spatial light modulators according to embodiments of the present invention

FIGS. 6, 7, 8, and 9 show illumination sources that allow for dose control according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system and method for pulse to pulse dose control for an illumination system, for example in a maskless lithography machine. The system and method can be used to decrease effective laser pulse-to-pulse variability in lithographic lasers, allowing adequate dose control using a minimum number of pulses (e.g. as little as one pulse).

Maskless Lithography Systems

FIG. 1 shows a maskless lithography system 100 according to an embodiment of the present invention. System 100 includes an illumination system 102 that transmits light to a reflective spatial light modulator 104 (e.g., a digital micromirror device (DMD), a reflective liquid crystal display (LCD), or the like) via a beam splitter 106 and SLM optics 108. SLM 104 is used to pattern the light in place of a reticle in traditional lithography systems. Patterned light reflected from SLM 104 is passed through beam splitter 106 and projection optics 110 and written on an object 112 (e.g., a substrate, a semiconductor wafer, a glass substrate for a flat panel display, or the like).

It is to be appreciated that illumination optics can be housed within illumination system 102, as is known in the relevant art. It is also to be appreciated that SLM optics 108 and projection optics 110 can include any combination of optical elements required to direct light onto desired areas of SLM 104 and/or object 112, as is known in the relevant art.

In alternative embodiments, either one or both of illumination system 102 and SLM 104 can be coupled to or have integral controllers 114 and 116, respectively. Controller 114 can be used to adjust illumination source 102 based on feedback from system 100 or to perform calibration. Controller 116 can also be used for adjustment and/or calibration. Alternatively, controller 116 can be used for turning ON and OFF active devices (e.g., pixels, mirrors, locations, etc.) 302 (see FIG. 3) on SLM 104, as was described above, to generate a pattern used to expose object 112. Controller 116 can either have integral storage or be coupled to a storage element (not shown) with predetermined information and/or algorithms used to generate the pattern or patterns.

Figure 2:
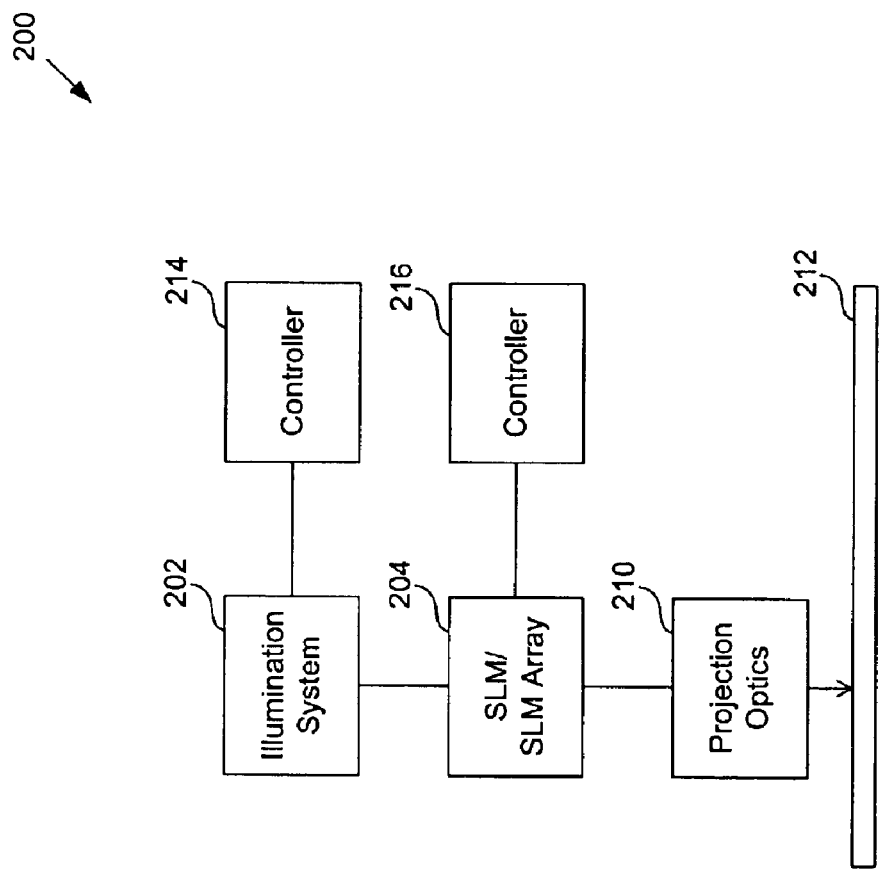
FIG. 2 shows a maskless lithography system having transmission spatial light modulators according to embodiments of the present invention.

FIG. 2 shows a maskless lithography system 200 according to a further embodiment of the present invention. System 200 includes an illumination source 202 that transmits light through a SLM 204 (e.g., a transmissive LCD, or the like) to pattern the light. The patterned light is transmitted through projection optics 210 to write the pattern on a surface of an object 212. In this embodiment, SLM 204 is a transmissive SLM, such as a liquid crystal display, or the like. Similar to above, either one or both of illumination source 202 and SLM 204 can be coupled to or integral with controllers 214 and 216, respectively. Controllers 214 and 216 can perform similar functions as controller 114 and 116 described above, and as known in the art.

Example SLMs that can be used in systems 100 or 200 are manufactured by Micronic Laser Systems AB of Sweden and Fraunhofer Institute for Circuits and Systems of Germany.

Merely for convenience, reference will be made only to system 100 below. However, all concepts discussed below can also apply to system 200, as would be known to someone skilled in the relevant arts.

Figure 3:
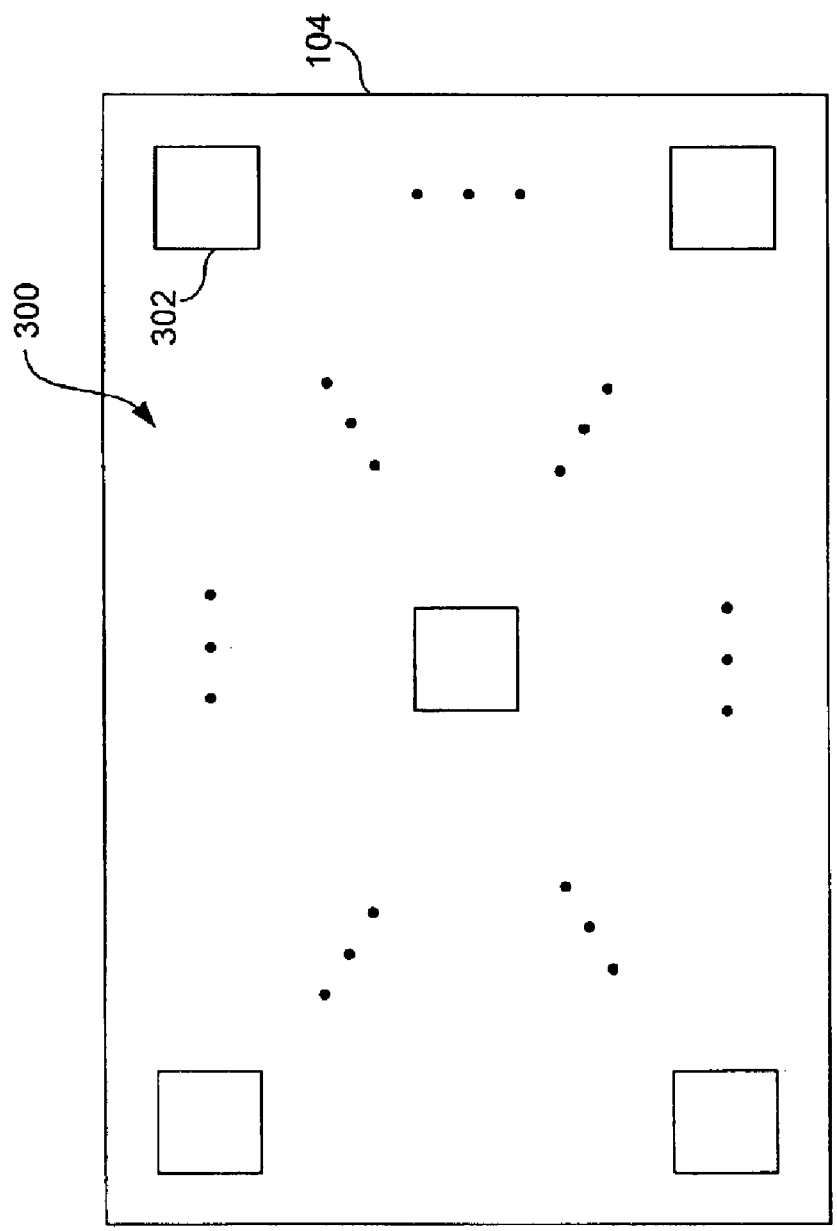
FIG. 3 shows a spatial light modulator according to an embodiment of the present invention.

FIG. 3 shows details of an active area 300 of SLM 104. Active area 300 includes an array of active devices 302

(represented by dotted patterns in the figure). Active devices 302 can be mirrors on a DMD or locations on a LCD. It is to be appreciated that active devices 302 can also be referred to as pixels, as is known in the relevant art. By adjusting the physical characteristics of active devices 302, they can be seen as being either ON or OFF. Digital or analog input signals based on a desired pattern are used to turn ON and OFF various active devices 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by SLM 104.

Figure 4:
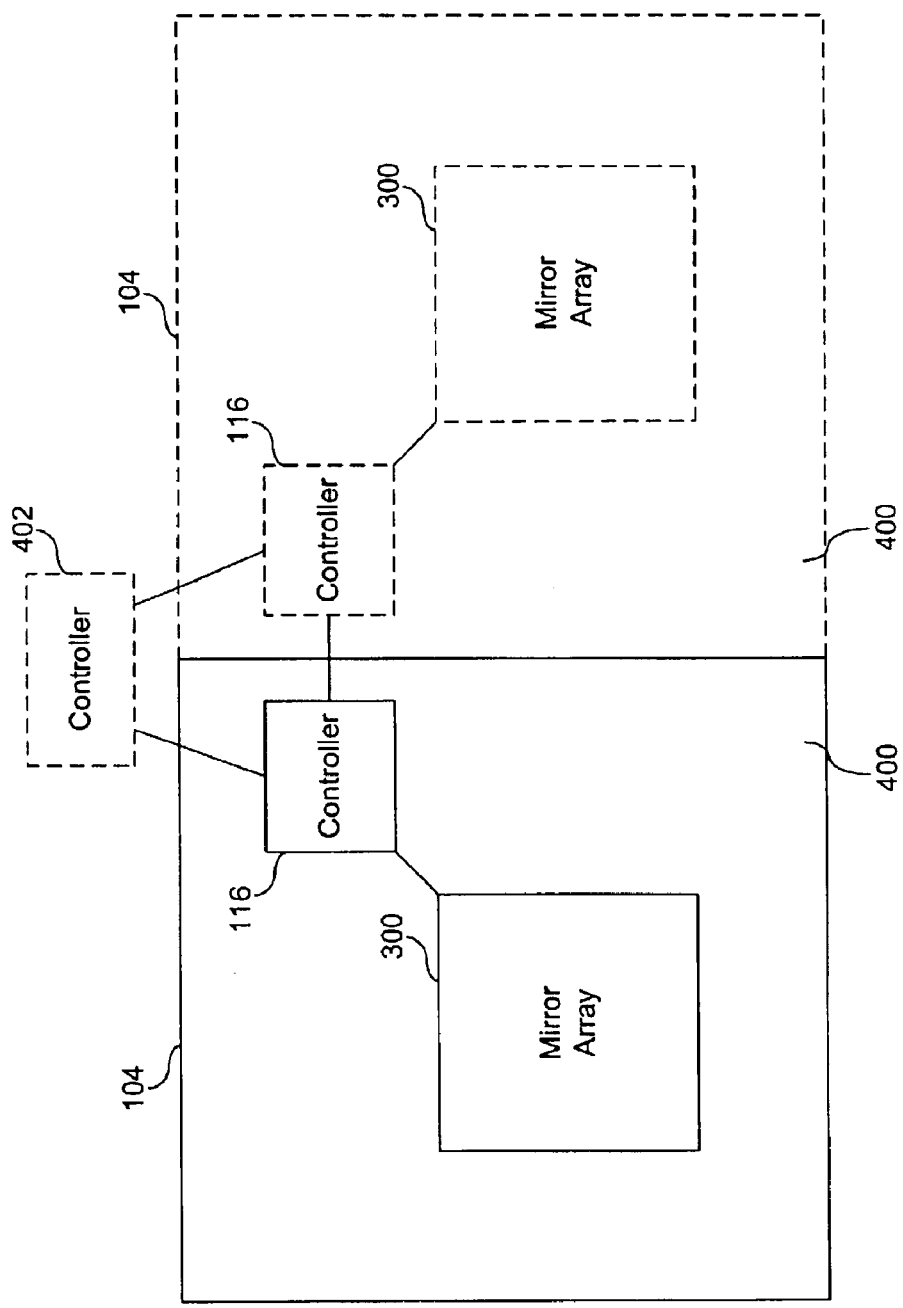
FIG. 4 shows more details of the spatial light modulator in FIG. 3.

FIG. 4 shows further details of SLM 104. SLM 104 can include an inactive packaging 400 surrounding active area 300. Also, in alternative embodiments, a main controller 402 can be coupled to each SLM controller 116 to monitor and control an array of SLMs (see discussion below). As discussed below, adjacent SLMs may be offset or staggered with respect to each other in other embodiments.

Spatial Light Modulator Array Configurations

Figure 5:
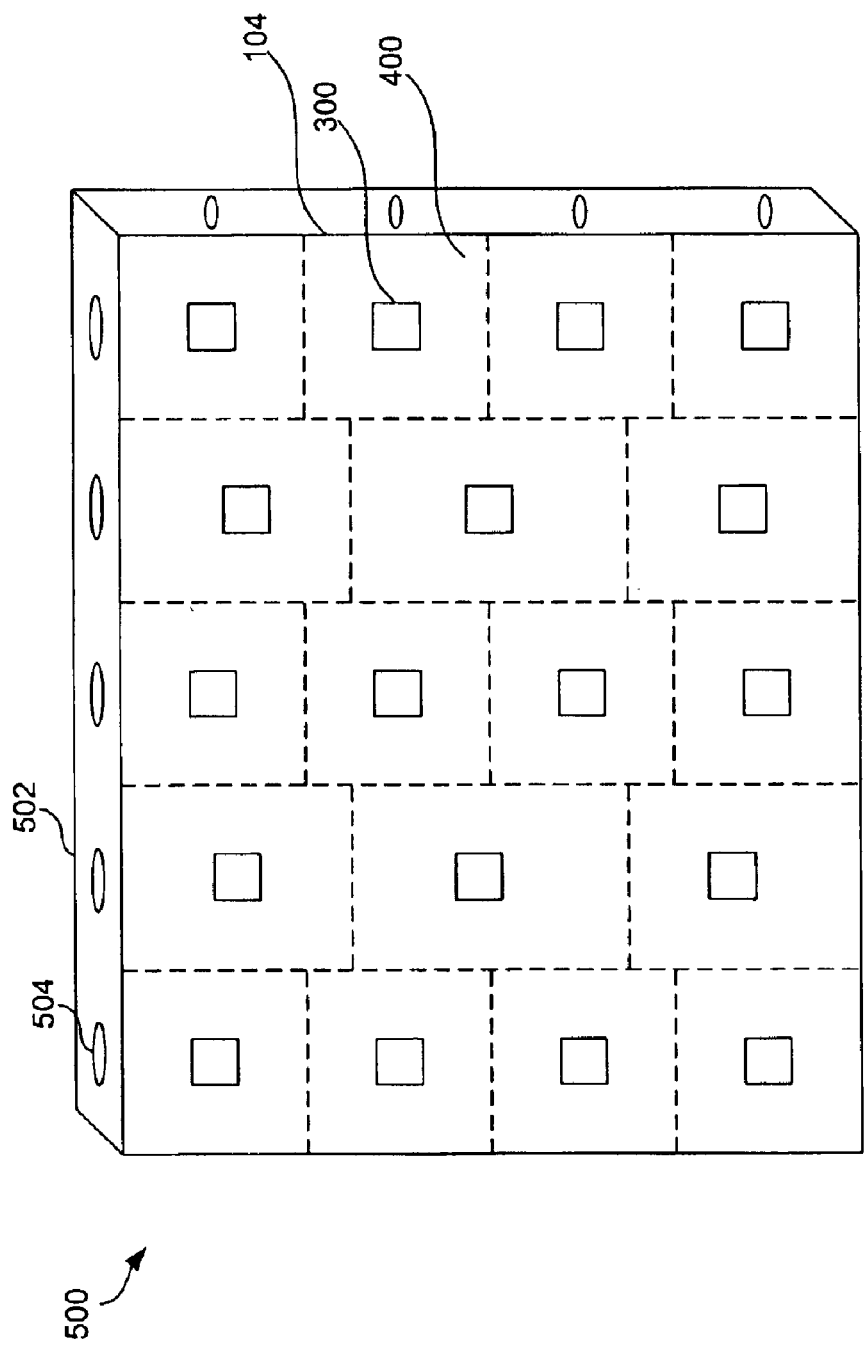
FIG. 5 shows an assembly according to embodiments of the present invention.

FIG. 5 shows an assembly 500 including a support device 502 that receives an array of SLMs 104. In various embodiments, as described in more detail below, the array of SLMs 104 can have varying numbers of columns, rows, SLMs per column, SLMs per row, etc., based on a number of desired exposures per pulse, or other criteria of a user. The SLMs 104 can be coupled to a support device 502. Support device 502 can have thermal control areas 504 (e.g., water or air channels, etc.), areas for control logic and related circuitry (e.g., see FIG. 4 showing elements 116 and element 402, which can be ASICs, A/D converters, D/A converters, fiber optics for streaming data, etc.), and windows 506 (formed within the dashed shapes) that receive SLMs 104, as is known in the relevant art. Support device 502, SLMs 104, and all peripheral cooling or control devices are referred to as an assembly. Assembly 500 can allow for a desired step size to produce the desired stitching (e.g., connecting of adjacent elements of features on object 112) and overlap for leading and trailing SLMs 104. By way of example, support device 502 can be 12 in×12 in or 10 in×10 in. Support device 502 can be used for thermal management based on being manufactured from a temperature stable material.

Support device 502 can be utilized as a mechanical backbone to ensure spacing control of SLMs 104 and for embedding the circuitry and the thermal controls areas 504. Any electronics can be mounted on either or both of a backside and front side of support device 502. For example, when using analog based SLMs or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

In some embodiments, when SLM 104 or electrical devices in the circuitry wear out, assembly 500 can easily be replaced. Although it would appear replacing assembly 500 is more costly than just a chip on assembly 500, it is in fact easier and quicker to replace the entire assembly 500, which can save production costs. Also, assembly 500 can be refurbished, allowing for a reduction in replacement parts if end users are willing to use refurbished assemblies 500.

Once assembly 500 is replaced, only an overall alignment is needed before resuming fabrication.

Illumination Systems with Dose Control

Figure 6:
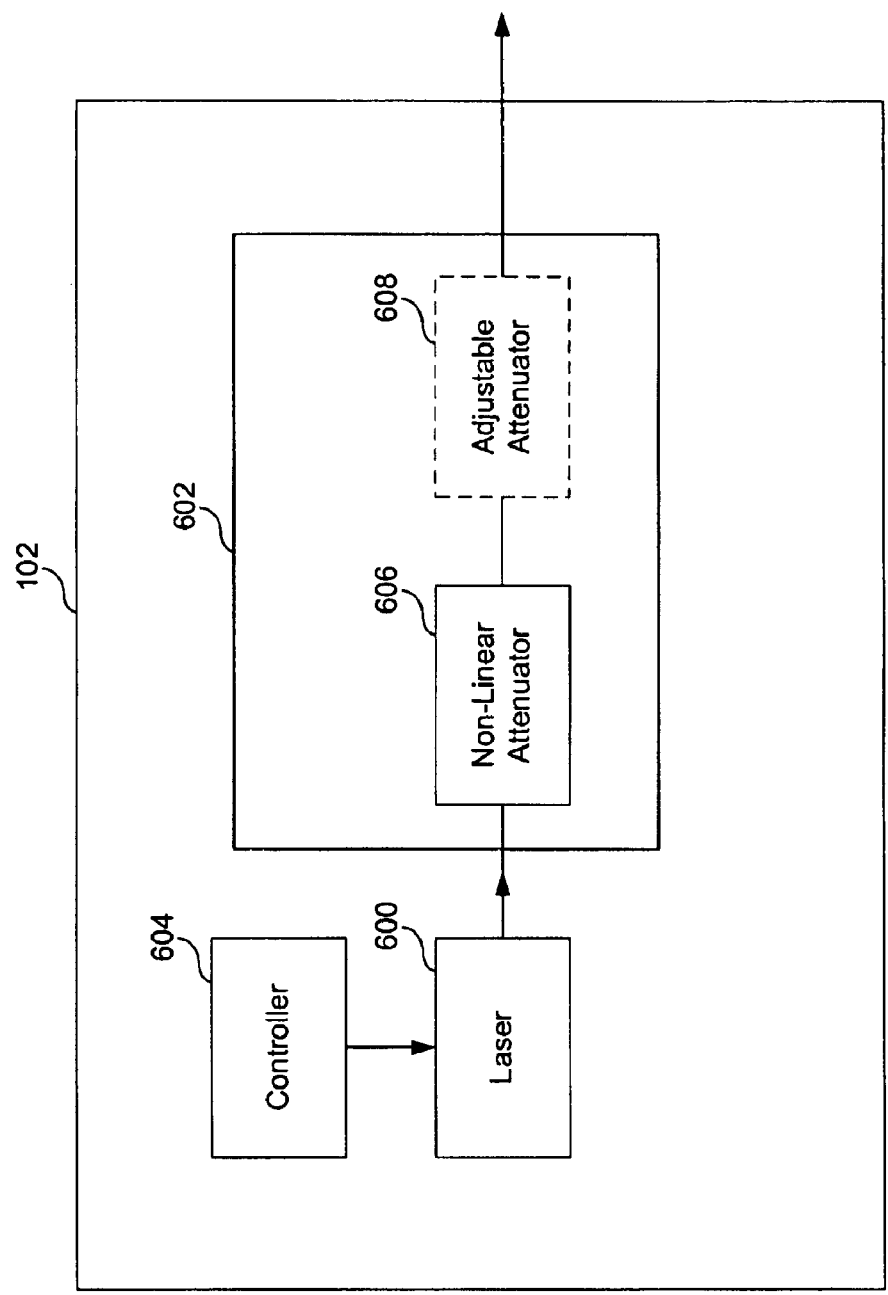

FIG. 6 shows details of illumination system 102. System 102 includes a light source 600 (e.g., a laser) and an adjusting system 602 (e.g., a passive adjusting system). In some embodiments, a controller 604 can be coupled to laser 600, which can be controller 114 or an additional controller. Adjusting system 602 includes a non-linear optical (NLO) attenuator 606 (e.g. reverse saturable absorber, keer lensing, an optical modulator, or the like) and can optionally include one or more adjustable attenuators, if needed. NLO attenuator 606 can be manufactured from semiconductor materials, such as silicon, silicon germanium, or the like. It is to be appreciated that different materials can be used based on the wavelength of light employed by a lithographic system.

With continuing reference to FIG. 6, in operation NLO attenuator 606 can act as an optical saturator making the effective output energy profile of each pulse constant. This is done by using a laser 600 that generates more energy than is needed. Then, NLO attenuator 606 directs light having a constant amount of energy towards the lithographic system, while NLO attenuator 606 absorbs energy at levels higher than a specified threshold. The threshold for NLO attenuator 606 can be set by utilizing appropriate optics to focus the laser pulse to a small enough size to achieve the necessary energy intensity on NLO attenuator 606. Hence, the energy per pulse that reaches the substrate can be stable pulse-to-pulse, and dose can be achieved in one or more pulses.

Figure 7:
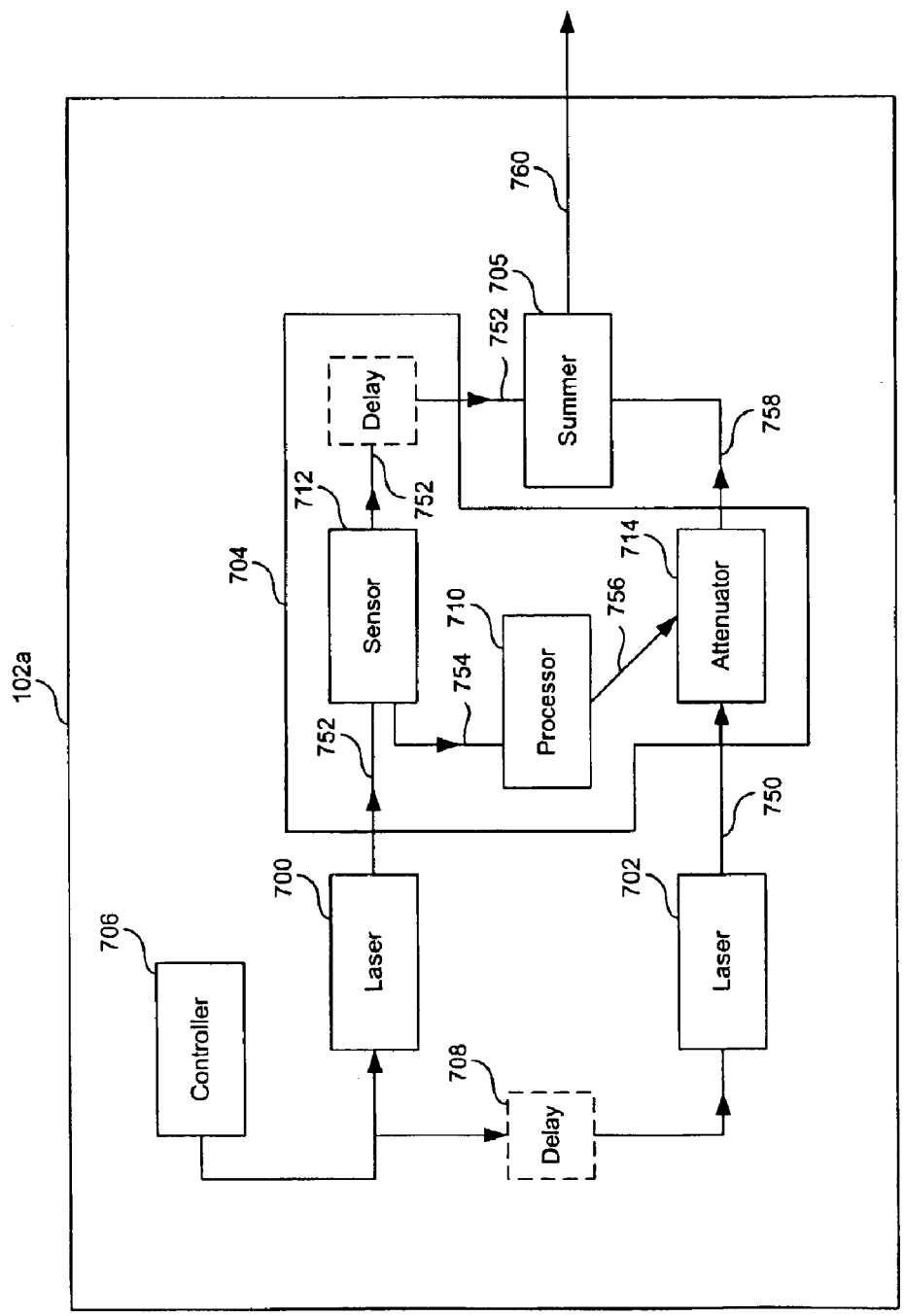

FIG. 7 shows details of an illumination system 102a according to another embodiment of the present invention. Illumination system 102a includes first and second light sources 700 and 702 (e.g., lasers), respectively, an adjusting system 704 (e.g., an active adjusting system), and a summing device 705 (e.g., combining device, summer, etc.). Laser 702 generates a light beam 750 having an energy about equal to an energy variation value of a light beam 752 generated from laser 700, as is described in more detail below. In some embodiments, a controller 706 can be coupled to lasers 700 and 702, possible via delay device 708, which can be controller 114 or an additional controller.

Adjusting system 704 can include a processor 710 coupled between a sensor 712, which is in a light path of laser 700, and an attenuator 714 (e.g., an adjustable attenuator, an optical modulator, etc.), which is in a light path of laser 702. Thus, beam 752 of laser 700 is measured with sensor 712. A sensed signal 754 from sensor 712 is processed in processor 710 to generate a control signal 756. Control signal 756 is fed into attenuator 714. Attenuator 714 can modulate light 750 from laser 702 based on control signal 756 to produce modulated light beam 758.

As an example, assume desired output beam 760 from illumination system 102 is 100 mJ. First laser 700 can produce 100 mJ with 1% variation (e.g., +/−1 mJ). Then, laser 702 would be designed to produce 1 mJ with 1% variation (e.g., +/−0.01 mJ). After sensor 712 measures actual energy in beam 752 from laser 700 it sends sensed signal 754 to processor 700 based on the measured value. An error amount is determined by processor 710 to generate control signal 756 that is sent to attenuator 714. Control signal 756 is used by attenuator 714 to modulate (e.g., to trim energy from) beam 750. Once trimmed, summing device 705 combines modulated light beam 758 with beam 752, possibly after beam 752 is delayed. Desired output beam 760 should now be approximately 100 mJ with about a 0.01% variation (+/−0.01 mJ).

It is to be appreciated that a time period between pulses 752 and 750 originating from laser 700 and laser 702 has to be short enough not to smear out an image being printed on object 112 beyond an acceptable tolerance. For example, assume a typical object speed of about 200 mm/s and a critical dimension (CD) of about 70 nm for a feature being printed. Furthermore, assume pulse 752 from laser 702 can be off by about 10% of the CD, or about 7 nm. Then, a maximum delay between pulses 752 and 750 can be about 35 ns. If controller 706 is not capable of processing the data within this time period, optional delay device 708 might be needed to delay pulse 750 from laser 702.

Figure 8:
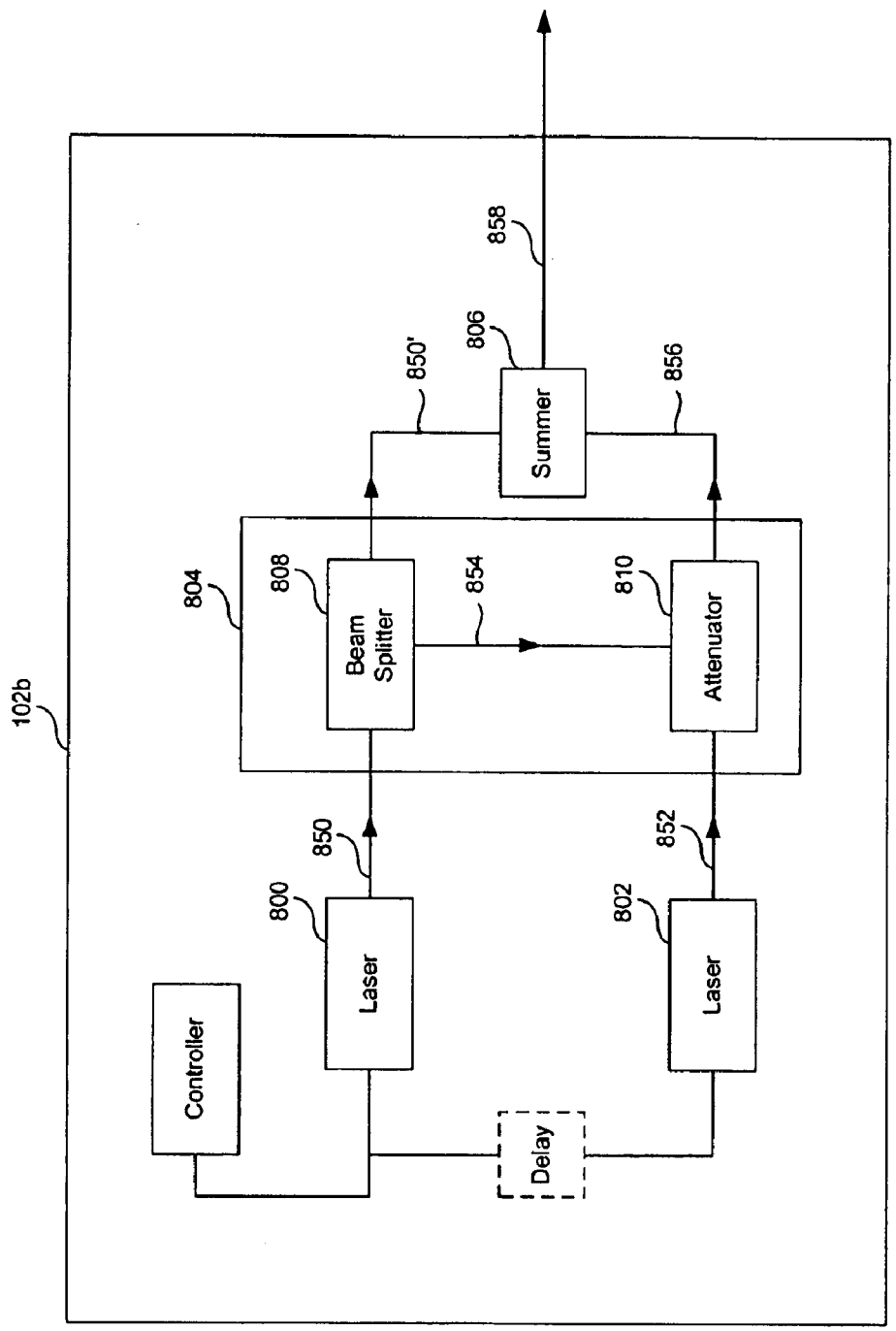

FIG. 8 shows details of an illumination system 102b according to another embodiment of the present invention. Illumination system 102b includes first and second light sources 800 and 802 (e.g., lasers), respectively, that pass light beams 850 and 852, respectively, through an adjusting system 804 (e.g., a passive adjusting system), and a summing device 806. Adjusting system 804 can include a beam splitter 808 in a light path of laser 800 and an attenuator 810 (e.g., a non-linear optical element, an optical modulator, etc.) in a light path of laser 802. A first portion 850' of light split by beam splitter 808 continues along the light path, while a second portion 854 of the light is directed to attenuator 810. Second portion 854 can be used to adjust an attenuation amount of attenuator 810. After being attenuated, an attenuated beam 856 is combined by summer 806 to form an output beam 858.

For example, using beam splitter 808, a small fraction (e.g., 1%) of beam 854 (e.g., a measuring beam) can be directed towards attenuator 810, which can change transmission of beam 852 based on the dose in the measuring beam 854. In this embodiment, no electronic processing is required, which allows system 100 to be relatively very fast. A delay between triggering of laser 800 and laser 802 can thus also be kept very short. Consequently, no delay lines will be needed in the light path for beam 850/850' from laser 800. Also, since only a small fraction of the total dose is directed through attenuator 810, degradation of attenuator 810 is greatly reduced.

Figure 9:
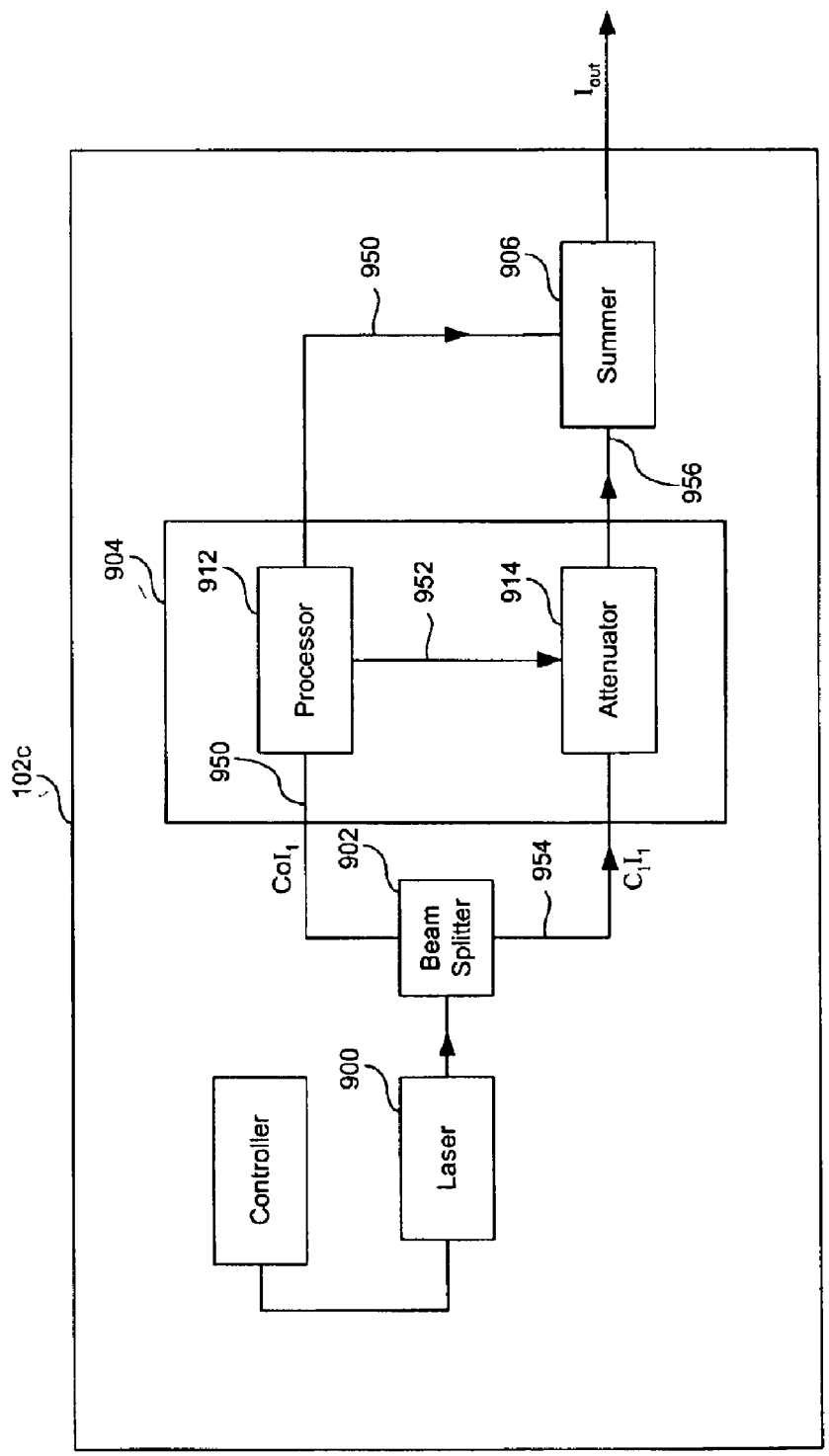

FIG. 9 shows details of an illumination system 102c according to another embodiment of the present invention. Illumination system 102c includes a light source 900 (e.g., a laser) that transmits light through a beam splitter 902 before the light is passed through an adjusting system 904 (e.g., an active adjusting system), and a summing device 906. In this embodiment only one laser 900 is used, which greatly reduces the system's complexity and costs. Adjusting system 904 includes a processor 912 that can measure an energy value of a first beam 950 from beam splitter 902. Processor 912 transmits a control signal 952 to an attenuator 914 (e.g., an active attenuator) based on the energy value. Attenuator 914 adjusts a second beam 954 from beam splitter 902 based on control signal 952 to generate an adjusted beam 956.

In operation, the light out of laser 900 is split into first and second beams 950 and 954, respectively. First beam 950 (e.g., a main beam) can have intensity $C_0 I_1$ and second beam 954 (e.g., a correction beam) can have intensity $C_1 I_1$, in which $I_1$ is the light intensity generated by laser 900. $C_0$ can be approximately, but less than, 1, and defines the intensity in main beam 950. $C_1$ is relatively smaller than $C_0$ (e.g., about 0.01 to 0.05), and defines the intensity in correction beam 954. Using the light intensity measured in main beam 950 the intensity of correction beam 954 is adjusted such that the total intensity $I_{out}$ remains constant. It can be calculated that the response function of attenuator 910 in the light path of correction beam 954 should be:

$$F(I_1) := \frac{Iout - C_0 \cdot I_1}{C_1 \cdot I_1}$$

to obtain a constant output.

The range in which the system can work is given by the constants $C_0$ and $C_1$. Since $F(I_1)$ cannot add light or produce negative light it can be calculated that the range is given by:

$$0 \leq \frac{Iout - C_0 \cdot I_1}{C_1 \cdot I_1} \leq 1$$

or $$\frac{Iout}{C_0 + C_1} \leq I_1 \leq \frac{Iout}{C_0}$$

As an example assume C1=0.05 and C0=0.95 then $I_1$ out of laser 900 should be within 0 and 5.3% of the desired system output Iout.

Illumination system 102c in FIG. 9 can measure both fluctuations in main beam 950 and fluctuations in correction beam 954. This may produce more accurate dose control, because in the other embodiments described above, fluctuations in the correction beam (independent laser) are not measured.

Thus, FIGS. 7, 8, and 9 can be seen as feed forward systems that leave the bulk of energy from a main beam alone, measure the main beam, and adjust a compensation beam to fine tune an output beam. Accordingly, an almost ideal output beam is generated from illumination source 102.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An illumination system comprising:

a light source; and an adjusting system including an optical attenuator that adjusts light output from the light source to produce a desired light output signal, wherein the adjusting system is one of a passive adjusting system and an active adjusting system.

2. The system of claim 1, wherein the optical attenuator comprises:

a non-linear attenuator.

3. The system of claim 2, wherein the light source produces a beam above a predetermined energy level and the non-linear attenuator is used to clip the light energy substantially at the predetermined energy level.

4. The system of claim 2, wherein the adjusting system further comprises:

an adjustable attenuator placed after the non-linear attenuator.

5. The system of claim 1, further comprising:
a beam splitter that splits the light output from the light source into a first beam that is diverted from the adjusting system and a second beam that is transmitted through the adjusting system, wherein the first beam has substantially less energy than the second beam; and
a summing device that combines the first beam and the second beam, after the second beam has passed through the adjusting system, to produce the desired light output signal.

6. The system of claim 5, wherein the adjusting system comprises:
a sensor that generates a sensor signal based on the energy of the second beam;
a processor that generates a control signal based on the sensor signal, wherein the control signal is used to control the adjusting system.

7. The system of claim 6, wherein the optical attenuator comprises:
an adjustable attenuator that is adjusted based on the control signal.

8. The system of claim 1, wherein the light source comprises:
a first laser generating a first light beam having a first energy value;
a delay device in a light path of the first light beam; and
a second laser generating a second light beam having a second energy value, the first energy value being higher than the second energy value, wherein the first light beam is passed through the adjusting system to adjust the second energy value,
wherein the delay device delays the first light beam relative to the second light beam.

9. The system of claim 8, further comprising:
a summer that combines the first light beam and the adjusted second light beam to produce the desired light output signal.

10. The system of claim 8, wherein:
the optical attenuator comprises an adjustable attenuator in a light path of the second light beam; and
the adjusting system further comprises:
a sensor that generates a sensed signal based on the first energy value; and
a processor that generates a control signal used to adjust the adjustable attenuator.

11. The system of claim 8, wherein the first light beam is generated earlier in time compared to the second light beam.

12. The system of claim 8, further comprising:
a controller that generates a control signal to control the first laser and the second laser; and
a delay device that receives and delays the control signal from the controller before the signal is received by the second laser.

13. The system of claim 1, wherein the light source comprises:
a first laser producing a first beam having a first energy value; and
a second laser producing a second beam having a second energy value.

14. The system of claim 13, further comprising:
a controller that generates a control signal to control the first laser and the second laser; and
a delay device that receives and delays the control signal from the controller before the signal is received by the second laser.

15. The system of claim 1, wherein:
the optical attenuator is an adjustable attenuator; and the system further comprises:
a beam splitter positioned after the light source to split the beam into first and second portions;
wherein the adjustable attenuator positioned in a light path of the the second portion, wherein the adjustable attenuator is adjusted based on an energy value of the first portion to adjust an energy value of the second portion; and
a summer that combines the adjusted second portion and the first portion to form the desired light output signal.

16. The system of claim 1, wherein the system is coupled to a maskless lithography device.

17. An illumination system, comprising:
a light source; and
a non-linear optical attenuator that attenuates light from the light source,
wherein the illumination system is arranged to be coupled to a maskless lithography device.

18. The system of claim 17, further comprising:
an adjustable optical attenuator positioned after the non-linear optical attenuator.

19. An illumination system, comprising:
a first light source that produces a first light beam having a first energy value;
a second light source that produces a second light beam having a second energy value;
an adjusting system that adjusts the second light beam based on the first energy value; and
a combining device that combines the adjusted second light beam and the first light beam.

20. The system of claim 19, wherein the adjusting system comprises:
a sensor that generates an energy signal based on the first energy value;
a processor that generates a control signal based on the energy signal;
an attenuator that performs the adjustment of the second light beam based on the control signal; and
a delay device that delays propagation of the first light beam after it has been sensed and before it is combined with the adjusted second light beam.

21. The system of claim 19, wherein the system is coupled to a maskless lithography device.

22. An illumination system, comprising:
a light source that generates a light beam;
a beam splitter that splits the light beam into first and second light beams;
an adjustment system that adjusts the first light beam based on an energy value of the second light beam; and
a combining device that combines the adjusted first light beam and the second light beam.

23. The system of claim 22, wherein the adjustment system comprises:
a processor that generates a control signal based on the energy value of the second light beam; and
an attenuator that performs the adjustment of the first light beam based on the control signal.

24. A maskless lithography system having an illumination system, the illumination system comprising:
a light source; and
an adjusting system that adjusts light output from the light source to produce a desired light output signal.

25. The system of claim 24, wherein the adjusting system comprises:

a non-linear attenuator.

26. The system of claim 25, wherein the light source produces a beam above a predetermined energy level and the non-linear attenuator is used to clip the light energy substantially at the predetermined energy level.

27. The system of claim 25, wherein the adjusting system further comprises:

an adjustable attenuator placed after the non-linear attenuator.

28. The system of claim 24, further comprising:

a beam splitter that splits the light output from the light source into a first beam that is diverted from the adjusting system and a second beam that is transmitted through the adjusting system, wherein the first beam has substantially less energy than the second beam; and a summing device that combines the first beam and the second beam, after the second beam has passed through the adjusting system, to produce the desire light output signal.

29. The system of claim 28, wherein the adjusting system comprises:

a sensor that generates a sensor signal based on the energy of the second beam;

a processor that generates a control signal based on the sensor signal, wherein the control signal controls the adjusting system.

30. The system of claim 29, wherein the adjusting system further comprises:

an adjustable attenuator that is adjusted based on the control signal.

31. The system of claim 24, wherein the light source comprises:

a first laser generating a first light beam having a first energy value;

a delay device in a light path of the first light beam; and a second laser generating a second light beam having a second energy value, the first energy value being higher than the second energy value, wherein the first light beam is passed through the adjusting system to adjust the second energy value, wherein the delay device delays the first light beam relative to the second light beam.

32. The system of claim 31, further comprising:

a summer that combines the first light beam and the adjusted second light beam to produce the desired light output signal.

33. The system of claim 31, wherein the adjusting system comprises:

an adjustable attenuator in a light path of the second light beam;

a sensor that generates a sensed signal based on the first energy value; and a processor that generates a control signal to adjust the adjustable attenuator.

34. The system of claim 31, wherein the first light beam is generated earlier in time compared to the second light beam.

35. The system of claim 31, further comprising:

a controller that generates a control signal to control the first laser and the second laser; and a delay device that receives and delays the control signal from the controller before the signal is received by the second laser.

36. The system of claim 24, wherein the light source comprises:

a first laser producing a first beam having a first energy value; and a second laser producing a second beam having a second energy value.

37. The system of claim 36, further comprising:

a controller that generates a control signal to control the first laser and the second laser; and a delay device that receives and delays the control signal from the controller before the signal is received by the second laser.

38. The system of claim 24, further comprising:

a beam splitter positioned after the light source to split the beam into first and second portions;

an adjustable attenuator positioned in a light path of the second portion, wherein the adjustable attenuator is adjusted based on an energy value of the first portion to adjust an energy value of the second portion; and a summer that combines the adjusted second portion and the first portion to form the desired light output signal.

39. The system of claim 24, wherein the adjusting system is a passive adjusting system.

40. The system claim 24, wherein the adjusting system is an active adjusting system.

* * * * *